United States Patent [19]

Stevens

[11] 4,435,652
[45] Mar. 6, 1984

[54] THRESHOLD VOLTAGE CONTROL NETWORK FOR INTEGRATED CIRCUIT FIELD-EFFECT TRRANSISTORS

[75] Inventor: Emsley H. Stevens, Plymouth, Minn.

[73] Assignee: Honeywell, Inc., Minneapolis, Minn.

[21] Appl. No.: 267,213

[22] Filed: May 26, 1981

[51] Int. Cl.³ .................... H03K 17/693; H03K 17/30
[52] U.S. Cl. ..................................... 307/297; 307/304
[58] Field of Search .................. 307/491, 497, 296 R, 307/297, 304; 323/313–316

[56] References Cited

U.S. PATENT DOCUMENTS

| | | | |
|---|---|---|---|
| 3,609,414 | 9/1971 | Pleshko | 307/304 X |
| 3,657,575 | 4/1972 | Taniguchi et al. | 307/304 |
| 3,750,018 | 7/1973 | Leone et al. | 307/297 X |
| 3,975,648 | 8/1976 | Tobey, Jr. et al. | 307/297 |
| 4,049,980 | 9/1977 | Maitland | 307/297 X |
| 4,115,710 | 9/1978 | Lou | 307/304 |
| 4,142,114 | 2/1979 | Green | 307/304 |
| 4,229,667 | 10/1980 | Heimbigner et al. | 307/297 |
| 4,311,923 | 1/1982 | Lüscher et al. | 307/297 X |
| 4,376,898 | 3/1983 | Desmarais | 307/297 |

OTHER PUBLICATIONS

Kubo et al., "A Threshold Voltage Controlling Circuit . . . ", IEEE Int'l Solid-State Circuits Conference, Session VI: MOS Techniques, 2-18-76.
Harroun, "Substrate Bias Voltage Control", *IBM Tech. Disc. Bull.*, vol. 22, No. 7, 12/79, pp. 2691-2692.
Caywood, John M., "A Novel for K Static RAM with Submilliwatt Standby Power,"*IEEE Transactions on Electron Devices*, vol. ED-26, No. 6, Jun. 1979, pp. 861-864.

*Primary Examiner*—Larry N. Anagnos
*Assistant Examiner*—David R. Hudspeth
*Attorney, Agent, or Firm*—Theodore F. Neils; David R. Fairbairn

[57] ABSTRACT

A threshold voltage control circuit controls the threshold voltages of one or more field-effect transistors (FETs) of an integrated circuit. The threshold voltage control circuit includes a reference (FET) which is electrically connected to the other FETs so that the threshold voltage of the reference FET determines the threshold voltages of the other FETs. A bias voltage is applied to a gate of the reference FET and a current path is established between first and second supply terminals. This current path includes the drain and source of the reference FET. The current flowing in the current path is a function of the bias voltage applied to the gate of the reference FET and the threshold voltage of the reference FET. A high gain, high input impedance amplifier is connected to the current path and provides a threshold control signal to the reference FET (and the other FETs) which is a function of the current in the current path. The threshold control signal causes the threshold voltage of the reference FET to attain a value which maintains a predetermined current flow in the current path.

6 Claims, 3 Drawing Figures

THRESHOLD VOLTAGE CONTROL NETWORK FOR INTEGRATED CIRCUIT FIELD-EFFECT TRRANSISTORS

BACKGROUND OF THE INVENTION

1. Field of the Invention

The present invention relates to field-effect transistor (FET) integrated circuits. In particular, the present invention relates to control of threshold voltage of FETs of an integrated circuit.

2. Description of the Prior Art

In integrated circuits which utilize FETs, it is important to achieve precise control of the threshold voltage of FETs forming the integrated circuit. Although significant advantages have been made by close control of device fabrication parameters, in many applications unavoidable variations in device fabrication parameters prevent the desired degree of control of threshold voltage.

In the past, threshold control circuits have been proposed which have used oscillators to provide charge pumping to the substrate of FET integrated circuits. U.S. Pat. Nos. 4,115,710 by Lou; 4,229,667 by Heimbigner et al; and 4,142,114 by Green show examples of this type of threshold control circuit.

Another problem which has been encountered in the fabrication of integrated circuit enhancement mode FETs is that in some fabrication processes a special threshold adjustment ion implantation step is not used because it is incompatible with the remainder of the device fabrication process. In these cases, there is a tendency of the resulting FETs to be weak depletion mode devices (with a threshold voltage on the order of −0.1 volt), rather than enhancement mode devices. For low power applications, enhancement mode devices are desired because they are normally "off" devices. Those FETs which turn out to be depletion mode devices are unsuitable, thus reducing yields.

FET integrated circuits have found wide application as semiconductor digital memories. For high speed reading and writing of data in the semiconductor memory, relatively high currents are required. These same current levels are not required, however, during standby conditions. One increasingly important requirement for semiconductor memories is low standby power drain, which necessarily means that low currents be used to maintain memory contents during standby. One technique for reducing circuit standby power is described in J. M. Caywood, et al, "A Novel 4K Static RAM with Submilliwatt Standby Power", IEEE Transactions on *Electron Devices*, Vol. ED-26, pages 861–864 (June 1979). In FIG. 6 of this article, a chip enable (CE) buffer circuit is illustrated which switches the memory from a "power down" state to a "power up" state upon application of a chip enable (CE) signal. The buffer circuit relies on charging a capacitor, which in turn transfers charge to gates internal to the memory circuit in order to switch the circuit from a power down to a power up state.

SUMMARY OF THE INVENTION

The present invention is a threshold voltage control circuit which controls the threshold voltage of a first FET in a monolithic integrated circuit. The threshold voltage control circuit includes a reference FET which is formed in the same integrated circuit with the first FET. The reference FET is electrically connected to the first FET so that the reference FET has a threshold voltage which determines the threshold voltage of the first FET.

The reference FET has a drain, a source, and a first gate. The threshold voltage control circuit includes a current path including the drain and source of the reference FET. The current flowing in the current path is a function of the threshold voltage of the reference FET.

The threshold voltage control circuit of the present invention further includes means for providing a threshold control signal to the reference FET which is a function of the current in the current path. The threshold control signal causes the threshold voltage of the reference FET (and therefore of the first FET) to attain a value which maintains the current flowing in the current path at a predetermined value. As a result, by proper selection of a bias voltage applied to the first gate and of the desired current value in the current path, the threshold voltage control circuit precisely controls the threshold voltage of the reference FET, and therefore the first FET.

In preferred embodiments of the present invention, the means for providing the threshold control signal includes a high gain, high input impedance amplifier having a first input terminal connected to the current path for receiving a first input signal which is a function of the current flowing through the current path, and a second input terminal for receiving a reference signal. The amplifier means has an output which applies the threshold control signal to the reference FET (and the first FET) as a function of the first input signal and the reference signal.

The threshold voltage control circuit of the present invention has several important applications. In one preferred embodiment, the threshold voltage control circuit provides precise control of threshold voltage, to compensate for variations in integrated circuit fabrication parameters.

In another embodiment of the present invention, the threshold voltage control circuit is used to convert weak depletion mode FETs to enhancement mode FETs. This is achieved solely by providing a threshold control signal which shifts the threshold voltage of the reference FET to an extent that it changes polarity.

In still another embodiment of the present invention, the threshold voltage control circuit is used to provide two different threshold voltage levels for the first FET. In this case, the first FET in turn controls current availability to the remaining portions of the integrated circuit, and thus determines whether the circuit is in a "power up" or "power down" mode of operation. In this embodiment, the current path, which includes the drain and source of the reference FET, also includes means for changing the impedance in the current path as a function of a control signal. When the control signal has a first state, the impedance in the current path has a first, higher value, thus resulting in a relatively low current flow through the current path. When the control signal has a second state, the impedance of the current path has a second, lower value, thus resulting in a higher current flow in the current path. As a result, the threshold voltage of the reference FET (and thus the threshold voltage of the first FET) changes as a function of the state of the control signal.

DETAILED DESCRIPTION OF THE PREFERRED EMBODIMENTS

Figure 1:
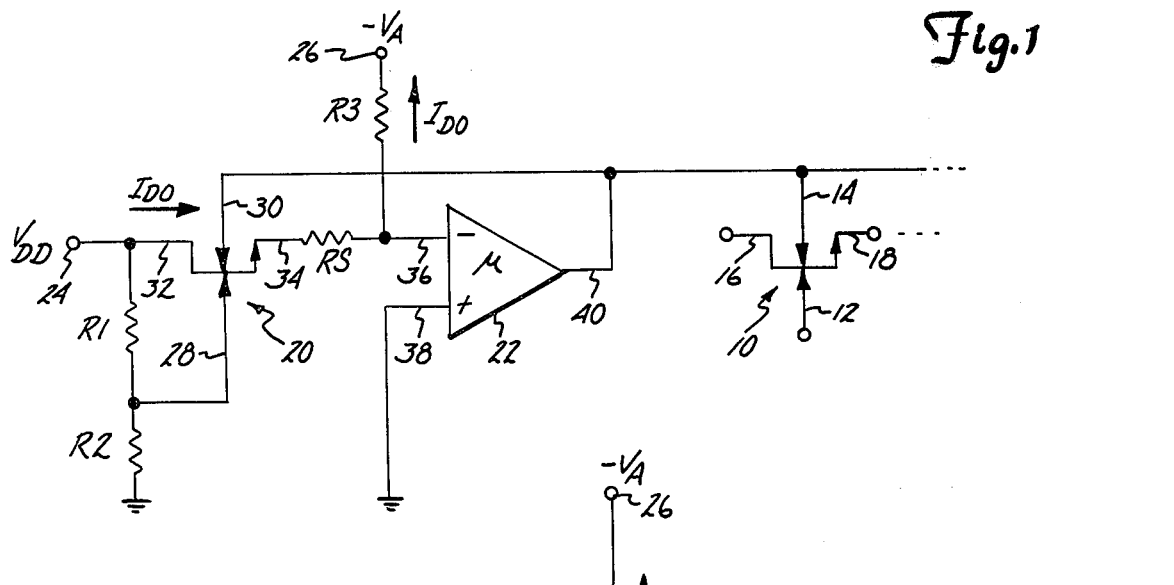
FIG. 1 is an electrical schematic diagram of a preferred embodiment of the threshold voltage control network of the present invention which controls threshold voltage of dual gate FETs.

FIG. 1 shows a network for controlling threshold voltage of dual gate FET 10, which is typically one of a plurality of dual gate FETs formed in a monolithic integrated circuit. As shown in FIG. 1, FET 10 has a first gate 12, a second gate 14, a drain 16, and a source 18. First gate 12 is typically a surface gate which is formed by a PN junction, a heterojunction, or a metal semiconductor Schottky barrier. Second gate 14 is typically a substrate gate which is formed by a PN junction or a heterojunction. In preferred embodiments of the present invention, there are a plurality of FETs in the integrated circuit which are identical in structure to FET 10 and have experienced nearly identical processing steps during fabrication of the integrated circuit. Each of these FETs has its second gate connected to second gate 14 of transistor 10.

The threshold voltage control network of the present invention shown in FIG. 1 includes dual gate reference FET 20, high gain, high input impedance amplifier 22, terminals 24 and 26, and resistors R1, R2, R3 and RS. Reference FET 20 is a dual gate FET formed in the same integrated circuit with FET 10 (and the other similar FETs). The threshold voltages of reference FET 20, FET 10 and the other similar FETs are controlled by the network of the present invention.

As shown in FIG. 1, reference FET 20 has a first gate 28, a second gate 30, a drain 32, and a source 34. The structure of reference FET 20 is preferably identical to that of FET 10, so that the characteristics (e.g. the threshold voltage) of reference FET 20 are essentially identical to the characteristics of FET 10.

As shown in FIG. 1, terminal 24 is connected to a first positive supply voltage $V_{DD}$, and terminal 26 is connected to second negative supply voltage $-V_A$. A current path is established between terminals 24 and 26 by reference FET 20 and resistors RS and R3. Drain 32 of FET 20 is connected to terminal 24; resistor RS is connected between source 34 of FET 20 and inverting (−) input terminal 36 of amplifier 22; and resistor R3 is connected between terminal 36 and terminal 26.

Resistors R1 and R2 form a voltage divider between terminal 24 and ground to establish a bias voltage at first gate 28 of reference FET 20. First gate 28 is connected to the junction of resistors R1 and R2.

As illustrated in FIG. 1, amplifier 22 has its noninverting (+) input 38 connected to a reference potential, in this case ground. Output terminal 40 of amplifier 22 is connected to a second gate 30 of reference FET 20, and to second gate 14 of FET 10. Amplifier 22 has an input impedance which is very large compared to resistor R3, so that essentially all of current $I_{DO}$ flowing through FET 20 and RS also flows through resistor R3. In the embodiment shown in FIG. 1, amplifier 22 adjusts its output voltage at output terminal 40 so as to maintain terminal 36 at virtual ground (i.e. so that it is equal to the reference potential at terminal 38). As a result, the current $I_{DO}$ is driven to the following value:

$$I_{DO} = V_A/R3 \qquad \text{Equation 1}$$

In order to maintain terminal 36 at virtual ground, amplifier 22 applies its output voltage to second gate 30 of FET 20. In this embodiment, reference FET 20 (as well as FET 10) is an enhancement mode FET, or a weak depletion mode FET. The output voltage supplied by amplifier 22 to second gate 30 has the effect of increasing the threshold voltage $V_T$ of reference FET 20 to a more positive value. This adjustment continues until balance is restored between terminals 36 and 38 of amplifier 22.

In the embodiment shown in FIG. 1, the current $I_{DO}$ flowing between drain 32 and source 34 of reference FET 10 is given approximately by the following relationship:

$$I_{DO} = K(V_{GS} - V_T)^2 \qquad \text{Equation 2}$$

Where $V_{GS}$ is the voltage between first gate 28 and source 34 of FET 20, $V_T$ is the threshold voltage of FET 20, and is controlled as a function of the voltage between second gate 30 and source 34, and K is a constant having a value which depends on the structure and materials forming FET 20.

Because output terminal 40 is connected to second gate 14 of FET 10, the threshold voltage of FET 10 is also controlled by the network of the present invention. By proper selection of values for the $V_A$ and R3, current $I_{DO}$ is established through FET 20 in accordance with Equation 1. The values of resistances R1, R2, and RS and the value of $V_{DD}$ establish the value of $V_{GS}$ for FET 20. Thus by Equation 2, the threshold voltage $V_T$ for FET 20 is determined. Then, precise control of the threshold voltage of FET 10, and all other similar FETs on the integrated chip can be achieved.

Depending upon the particular threshold voltage desired, the bias circuit established by resistors R1 and R2 can vary from the case where R1 equals zero and R2 equal infinity to the case in which R2 equals zero and R1 equals infinity. Similarly, resistor RS, which establishes the voltage at source 34 of reference FET 20 can in some cases be zero, so that source 34 is connected directly to terminal 36 of amplifier 22. Resistance RS is selected to be essentially the same as the resistance between the source 18 of FET 10 and circuit ground.

As discussed previously, because of fabrication process variations FETs 10 and 20 may be either enhancement mode devices, or weak depletion mode devices. In either case, the voltage output of amplifier 22 is applied to reverse bias second gates 30 and 14 to adjust channel height, and thus threshold voltage of FETs 20 and 10, respectively, to provide in operation effectively just enhancement devices.

The conversion of weak depletion mode devices to enhancement mode devices is a highly attractive feature of the network of the present invention. In some fabrication processes, a special threshold adjustment ion implantation step is not used because it is incompatible with the remainder of the device fabrication process. In these cases, there is a tendency of the resulting FETs to be weak depletion mode devices, when enhancement mode devices are actually desired. With the network of the present invention, weak depletion mode devices may be converted in operation to enhancement mode devices. This converts integrated circuits which otherwise would be unusable into usable devices by post fabrication control of threshold voltage. Thus device yields of processes in which special threshold fabrication implantations are not possible can be significantly improved.

Figure 2:
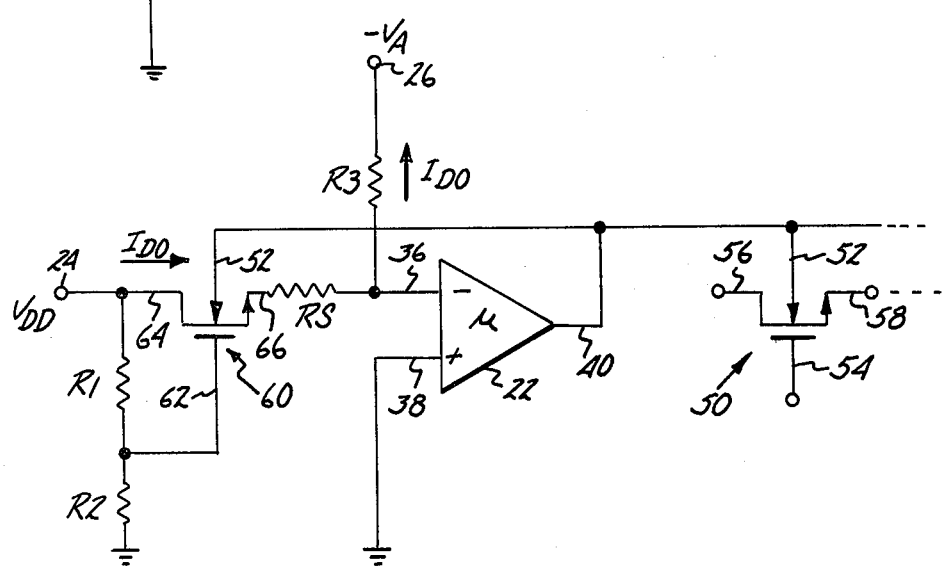
FIG. 2 is an electrical schematic diagram of another embodiment of the threshold control voltage network of the present invention for controlling threshold voltage of N-channel MOS FETs.

FIG. 2 shows another embodiment of the present invention in which the threshold voltage of N channel MOS FET 50 is controlled. FET 50 of FIG. 2 is formed in a semiconductor substrate 52 serving as a substrate for an entire monolithic interacted circuit, and has a gate 54, a drain 56, and a source 58.

The threshold control network of FIG. 2 is generally similar to the network of FIG. 1, except that N channel reference MOS FET 60, formed in the same semiconductor substrate 52 as FET 50, has replaced reference FET 20 of the network of FIG. 1. Similar reference characters and numerals are used in FIG. 2 to designate similar circuit elements. Reference FET 60 has a gate 62 connected to the junction of resistors R1 and R2, a drain 64 connected to terminal 24, and a source 66 connected to resistance RS.

The network of FIG. 2 operates in a manner similar to the network of FIG. 1, with the output of amplifier 22 supplying a threshold control output voltage to substrate 52. Threshold control is accomplished by adjustment of the subchannel depletion layer charge through the reverse bias voltage applied by output 40 of amplifier 22 between substrate 52 and sources 58 and 66 of FETs 50 and 60, respectively. The operation of the network of FIG. 2 is identical to that of FIG. 1 in adjusting the threshold voltage.

Although the network shown in FIG. 2 adjusts threshold voltage of N channel MOS FETs, it is equally applicable to threshold control of P channel FETs, if the necessary changes are made in the polarities of voltages applied to terminals 24 and 26. Similarly, although FETs 50 and 60 were specifically described as MOS (metal-oxide-semiconductor) FETs, other kinds of insulated gate FETs are also contemplated, such as silicon gate FETs.

The network of FIG. 2, like the network of FIG. 1, may be used to convert depletion mode FETs to enhancement mode FETs with a precisely controlled threshold voltage. As described previously, this provides the capability to achieve significant increases in device yields in those monolithic integrated circuit fabrication processes from which enhancement mode FETs are desired, but from which weak depletion mode FETs are often the result.

Figure 3:
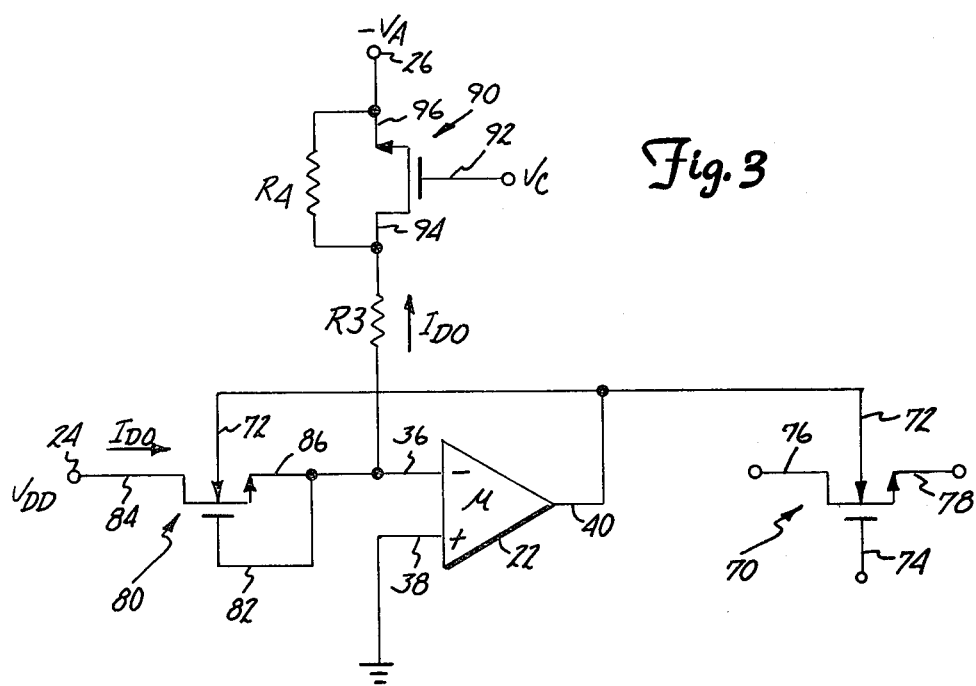
FIG. 3 is an electrical schematic diagram of a preferred embodiment of the present invention which controls the threshold voltage of a current control FET of an integrated circuit semiconductor memory to thereby provide power up and power down conditions.

FIG. 3 shows a network in accordance with the present invention which is useful in controlling power-up and power-down conditions of N MOS digital circuits, such as random access memories. The network shown in FIG. 3 is generally similar to the networks shown in FIGS. 1 and 2 and is also intended to typically be fabricated in a monolithic integrated circuit. Similar elements are designated with similar reference numerals and characters.

In N MOS digital circuits having power-up and power-down features, available current in either the power-up or the power-down conditions is typically controlled by an N channel depletion mode FET. In FIG. 3, FET 70 is this N channel depletion mode FET which controls available current for the remainder of the digital circuit (not shown). FET 70 is formed in the common semiconductor substrate 72 with the other FETs of the digital circuit, and has a gate 74, a drain 76, and a source 78.

Reference FET 80 of the network of the present invention is a depletion mode transistor formed in substrate 72, and has a gate 82, a drain 84, and a source 86. Gate 82 is connected to source 86 and to inverting (−) input terminal 36 of amplifier 22. Drain 84 is connected to supply terminal 24, which receives a supply voltage $V_{DD}$.

Amplifier 22 has its noninverting (+) input terminal 38 connected to ground, and has its output terminal 40 connected to substrate 72. As in the embodiments shown in FIGS. 1 and 2, in FIG. 3 the output voltage at terminal 40 of amplifier 22 supplies a reverse bias voltage to substrate 72, thus controlling channel height and threshold voltage of FETs 70 and 80.

The network of FIG. 3 also includes control FET 90, which is an enhancement mode N channel MOS FET having a gate 92, a drain 94, and a source 96. Gate 92 of FET 90 is connected to receive a control voltage $V_C$ which has one of two values ($V_C=0$, and $V_C=-V_A$). Drain 94 of control FET 90 is connected to resistor R3, and source 96 is connected to terminal 26. Resistor R4 is connected between drain 94 and source 96.

In preferred embodiments of the present invention, control FET 90 is electrically isolated in being prevented from being electrically connected through the substrate to FETs 70 and 80. This avoids a forward bias being applied between drain 94 and substrate 72. This electrical isolation can be achieved, for instance by appropriate isolation regions on the same integrated chip as FETs 70 and 80, or by control FET 90 being in a structure outside the integrated circuit chip.

In operation, the network of FIG. 3 controls the current $I_{DO}$ through reference FET 80 at two different levels, depending upon the state of control transistor 90. As a result, the current flow permitted through FET 70 also has two different levels: a high current level for power-up condition, and a low current level for power-down condition.

Power-up condition is provided when $V_C$ equals zero. In this condition, control FET 90 is turned on, thus shorting out resistor R4. Current $I_{DO}$ is, therefore, driven to a value given by Equation 1, since amplifier 22 applies a threshold control voltage to substrate 72 to cause input terminal 36 to be at virtual ground.

Power-down condition is achieved when $V_C$ equals $-V_A$. In this condition, control FET 90 is turned off, and resistor R4 is connected in series with resistor R3 between terminal 36 and terminal 26. Amplifier 22 applies a threshold control voltage which changes the threshold voltage of transistors 70 and 80 until input 36 is again at virtual ground and $I_{DO}$ has the following value:

$$I_{DO} = V_A/(R_3+R_4) \qquad \text{Equation 3}$$

It can be seen, therefore, that the value of current $I_{DO}$ permitted during power-down conditions (as shown by Equation 3) is less than the value of $I_{DO}$ permitted during power-up conditions (as shown by Equation 1). The values of $I_{DO}$ in power-up and power-down conditions can be selected independently in the present invention, since the values of resistors R3 and R4 can be chosen independently. If resistor R4 is selected to be infinity, complete power-down is provided when control transistor 90 is turned off.

With the network of FIG. 3, power-up and power-down conditions may be maintained indefinitely, without requiring a periodic reapplication of a chip enable signal. This is because the network of FIG. 3 is a static-type device, which does not rely upon the charge on a capacitor to maintain power-up or power-down conditions. As long as the control voltage $V_C$ has a value which turns transistor 90 on, power-up conditions are maintained. Similarly, as long as $V_C$ has a value which turns control FET 90 off, power-down conditions are maintained.

In conclusion, the networks of the present invention provide advantageous postfabrication adjustment of the threshold voltage of field effect transistors. This threshold voltage control not only permits precise control of threshold voltage, but also permits conversion of weak depletion mode FETs to enhancement mode FETs. Furthermore, as illustrated by the network of FIG. 3, the present invention permits control of power-up and power-down conditions in digital integrated circuits.

The threshold voltage control networks of the present invention are simple, and can be included either entirely on an integrated circuit chip with the transistors which they control, or may be constructed externally to the integrated circuit chip (except, of course, for the reference FET) by using readily available circuit components.

The networks of the present invention are usable with a wide variety of different FETs, including JFETs, MOS FETs and metal semiconductor FETs. Both P channel and N channel devices may be controlled with the networks of the present invention, as well as both enhancement mode and depletion mode devices. In many cases, conversion of the network from N channel to P channel devices requires only a simple change of circuit polarities.

Although the present invention has been described with reference to preferred embodiments, workers skilled in the art will recognize that changes may be made in form and detail without departing from the spirit and scope of the invention.

What is claimed is:

1. A threshold voltage control circuit for controlling threshold voltages of selected field-effect transistors formed as part of an integrated circuit and having respective drains, sources and gates thereof electrically interconnected in said integrated circuit in any desired manner including a first field-effect transistor, said threshold voltage control circuit comprising:

a reference field-effect transistor formed as part of said integrated circuit having a drain, a source and a first gate with said first gate and source electrically connected together, with said reference field-effect transistor being electrically connected to said first field-effect transistor such that said reference field-effect transistor has a threshold voltage which determines that threshold voltage associated with said first field-effect transistor, said reference field-effect transistor drain being electrically connected to a first terminal means characterized as being connectible to a first voltage source;

an impedance means electrically connected to a second terminal means characterized as being connectible to a second voltage source and electrically connected to said reference field-effect transistor source wherein said impedance means has a first or a second impedance value depending on values of a control signal; and means for providing threshold voltage control to said reference field-effect transistor depending on impedance values taken by said impedance means to cause said threshold voltage of said reference field-effect transistor to attain a value which maintains current flowing between source and drain of said reference field-effect transistor substantially equal to that flowing through said impedance means, said threshold voltage of said reference field-effect transistor having a first value when said impedance means has said first impedance value and having a second value when said impedance means has said second impedance value.

2. The threshold voltage control circuit of claim 1 wherein said means for providing threshold control comprises:

a high gain, high input impedance amplifier means having a first inverting input terminal and a second non-inverting input terminal and an output, said first input terminal being connected to said reference field-effect transistor source, said second input terminal for receiving a reference signal, and said output being connected to said reference field-effect transistor.

3. The threshold voltage control circuit of claim 1 wherein said reference field-effect transistor has a second gate, and wherein said first field-effect transistor has first and second gates, said second gate of said first field-effect transistor being electrically connected to said second gate of said reference field-effect transistor; and wherein said means for providing threshold control is electrically connected to said second gates of both of said reference field-effect transistor and said first field-effect transistor.

4. The threshold voltage control circuit of claim 1 wherein said reference field-effect transistor and said first field-effect transistor have a common substrate, and wherein said means for providing threshold control is electrically connected to said common substrate.

5. The threshold voltage control circuit of claim 4 wherein said reference field-effect transistor and said first field-effect transistor are depletion mode field-effect transistors.

6. The threshold voltage control circuit of claim 4 wherein said impedance means includes first and second resistors connected in series between said source of said reference field-effect transistor and said second terminal means, and wherein a semiconductor switch means having a control electrode characterized as receiving said control signal and having first and second electrodes is connected in parallel with said second resistor.

* * * * *